(12) United States Patent
Sumant

(10) Patent No.: US 8,673,164 B2
(45) Date of Patent: Mar. 18, 2014

(54) SIMPLE METHOD TO FABRICATE NANO-POROUS DIAMOND MEMBRANES

(75) Inventor: Anirudha V. Sumant, Plainfield, IL (US)

(73) Assignee: UChicago Argonne, LLC, Chicago, IL (US)

( * ) Notice: Subject to any disclaimer, the term of this patent is extended or adjusted under 35 U.S.C. 154(b) by 308 days.

(21) Appl. No.: 13/248,074

(22) Filed: Sep. 29, 2011

(65) Prior Publication Data

US 2013/0084436 A1  Apr. 4, 2013

(51) Int. Cl.
    *C03C 25/00*  (2006.01)
(52) U.S. Cl.
    USPC .............. 216/39; 216/56; 216/99; 427/249.8; 427/249.12
(58) Field of Classification Search
    USPC ................. 216/39, 56, 99; 427/249.8, 249.12
    See application file for complete search history.

(56) References Cited

U.S. PATENT DOCUMENTS

| 6,811,612 | B2* | 11/2004 | Gruen et al. ............... 117/94 |
| 2010/0015355 | A1* | 1/2010 | Gavalas ..................... 427/560 |
| 2011/0120890 | A1* | 5/2011 | Macpherson et al. ...... 205/792 |
| 2012/0125848 | A1* | 5/2012 | Friedberger et al. ...... 210/650 |
| 2012/0256517 | A1* | 10/2012 | Bayram .................... 310/300 |
| 2013/0156974 | A1* | 6/2013 | Scorsone et al. .......... 427/577 |

OTHER PUBLICATIONS

"Nanoporous ultrananocrystalline diamond membranes," by Olga Makarova et al., J. Vac. Sci. Technol. B 28,,6 . . . , Nov./Dec. 2010.

* cited by examiner

*Primary Examiner* — Binh X Tran
(74) *Attorney, Agent, or Firm* — Joan Pennington

(57) ABSTRACT

A method to fabricate nanoporous diamond membranes and a nanoporous diamond membrane are provided. A silicon substrate is provided and an optical lithography is used to produce metal dots on the silicon substrate with a predefined spacing between the dots. Selective seeding of the silicon wafer with nanodiamond solution in water is performed followed by controlled lateral diamond film growth producing the nanoporous diamond membrane. Back etching of the under laying silicon is performed to open nanopores in the produced nanoporous diamond membrane.

16 Claims, 4 Drawing Sheets

METAL PATTERNING
(USING LASER WRITER)
100

SELECTIVE SEEDING + UNCD GROWTH
110

120
BACK ETCHING OF SI
(USING KOH)

300
NANOPOROUS DIAMOND MEMBRANE

SIMPLE METHOD TO FABRICATE NANO-POROUS DIAMOND MEMBRANES

CONTRACTUAL ORIGIN OF THE INVENTION

The United States Government has rights in this invention pursuant to Contract No. DE-AC02-06CH11357 between the United States Government and UChicago Argonne, LLC representing Argonne National Laboratory.

FIELD OF THE INVENTION

The present invention relates to a method to fabricate nanoporous diamond membranes and an enhanced nanoporous diamond membrane.

DESCRIPTION OF THE RELATED ART

Nanoporous diamond membranes provide unique materials properties needed for various nanoporous membrane application in various technologically important areas, such as water purification, water desalination, and detection of water contaminants, DNA sequencing, sorting, bio-sensors, and the like.

One major problem associated with producing nanoporous membranes is the inability to produce these nanoporous membranes on a large area and at a reasonable cost.

The existing technology for producing nanoporous membranes generally involves the use of highly sophisticated tools to be used in clean rooms, such as e-beam lithography, and reactive ion etching (RIE), or focused ion beam (FIB) milling.

The existing technology for producing nanoporous membranes are inherently slow and costly and therefore are not cost effective.

A need exists for an efficient and effective method for fabricating nanoporous diamond membranes. It is desirable to provide such method that substantially eliminates the use of high-tech and costly equipments such as e-beam lithography and reactive ion etching or focused ion beam milling and many fabrication steps associated in using them.

SUMMARY OF THE INVENTION

A principal aspect of the present invention is to provide a method to fabricate nanoporous diamond membranes and a nanoporous diamond membrane. Other important aspects of the present invention are to provide such method and nanoporous diamond membrane substantially without negative effect and that overcome some of the disadvantages of prior art arrangements.

In brief, a method to fabricate nanoporous diamond membranes and a nanoporous diamond membrane are provided. A silicon substrate is provided and an optical lithography is used to produce patterned metal dots on the silicon substrate with a predefined spacing between the dots. Selective seeding of the silicon wafer with nanodiamond solution in water is performed with only metal dots being seeded with nanodiamond nuclei and not the silicon surface. This is followed by controlled lateral diamond film growth producing the nanoporous diamond membrane. Back etching of the under laying silicon is performed to open nanopores in the produced nanoporous diamond membrane.

In accordance with features of the invention, the produced nanoporous diamond membrane includes a substantially uniform membrane diamond membrane having nanopores having a small pore diameter, for example, in a range between 30 nm and 70 nm.

In accordance with features of the invention, the metal dots are submicron sized and ultrathin, such as approximately 10 nm. The metal dots include a carbide forming metal layer, for example, formed of Tungsten (W), Titanium (Ti), Tantalum (Ta), or Molybdenum (Mo).

In accordance with features of the invention, the cost associated in producing nanopores on large area is substantially reduced as compared to conventional fabrication techniques.

In accordance with features of the invention, the use of selective nucleation of nanodiamond and controlled lateral growth to produce nanoporous diamond membrane or diamond films with nanopores of approximately 30 nm diameter.

In accordance with features of the invention, the selective seeding of the metal dots on the silicon wafer with nanodiamond solution in water includes ultrasonic seeding of the silicon wafer in water, where water does not wet the silicon surface due to the hydrophobic nature of the silicon surface. Whereas metal dots attracts nanodiamond seeds due to electrostatic interaction. Selective seeding of the metal dots thus results in diamond growth only on these seeded areas. By controlling the distance between seeded areas and the diamond growth time, overall coalescence of the diamond film can be controlled leaving behind tiny nanopores.

BRIEF DESCRIPTION OF THE DRAWINGS

The present invention together with the above and other objects and advantages may best be understood from the following detailed description of the preferred embodiments of the invention illustrated in the drawings, wherein:

FIGS. 3A and 3B illustrate respective example nanoporous diamond membranes in accordance with the preferred embodiment.

DETAILED DESCRIPTION OF THE PREFERRED EMBODIMENTS

In accordance with features of the invention, a method to fabricate nanoporous diamond membranes and a nanoporous diamond membrane are provided. The fabrication time required and the cost associated in producing nanopores on a relatively large area are substantially reduced as compared to conventional fabrication techniques. The process of the invention is based on selective nucleation of nanodiamond and controlled lateral growth to produce nanopores in diamond films down to 30 nm diameter, which potentially may be further scaled down, for example, to few nanometers, without requiring the use of e-beam lithography and RIE processes.

The method of the invention provides controlled lateral growth of the nanoporous diamond membrane or film by using a selective seeding process so that lateral diamond growth is accelerated at the seeded areas as compared to the non-seeded areas. The selective seeding process of the invention is a water based seeding process, different from the conventional seeding process which is generally carried out using alcohol containing solution. The conventional seeding process does not distinguish between metal and silicon surface due to wetting properties of alcohol based solutions and therefore cannot be used as a selective seeding process. Water does not wet the silicon surface due to the hydrophobic nature of the silicon surface. This property of the water based seeding process enables selectively seeding only metal coated areas or the patterned metal dots due to electrostatic interaction and diamond growth occurs only on these seeded areas. By controlling the distance between metal dots defining seeding areas and the diamond growth time, overall coalescence of the diamond film is advantageously controlled leaving behind tiny pinholes or nanopores.

Having reference now to the drawings, in 1A, 1B, and 1C, there are shown exemplary processing steps for fabricating nanoporous diamond membranes in accordance with the preferred embodiment.

Figure 1A:
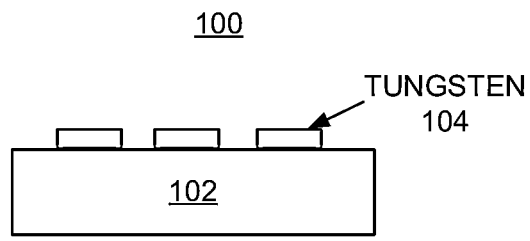
FIGS. 1A, 1B, and 1C are schematic cross-sectional side views illustrating exemplary processing steps for fabricating nanoporous diamond membranes in accordance with the preferred embodiment.

Referring to FIG. 1A, the processing method begins with a first processing step generally designated by the reference character 100 with a silicon wafer or silicon substrate 102. An optical lithography or laser write is used to produce patterned metal dots 104 on the silicon substrate 102 with a predefined spacing between the dots.

The patterned metal dots 104 are submicron sized and ultrathin, such as approximately 10 nm. The metal dots 104 include a patterned carbide forming metal layer, for example, formed of Tungsten (W), Titanium (Ti), Tantalum (Ta), or Molybdenum (Mo).

Figure 1B:
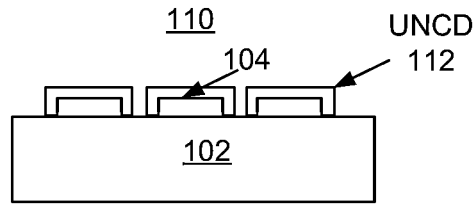

Referring to FIG. 1B, a next processing step is generally designated by the reference character 110. Selective seeding of the patterned metal dots 104 on the silicon substrate 102 with nanodiamond solution in water is performed, where water does not wet the silicon surface due to the hydrophobic nature of the silicon surface. The selective seeding is followed by controlled lateral diamond film growth indicated by ultrananocrystalline Diamond (UNCD) 112 producing the nanoporous diamond membrane.

The selective seeding of the metal dots 104 on the silicon wafer substrate 102 includes ultrasonic seeding of the silicon wafer with detonated nanocrystalline diamond in deionized (DI) water. Selective seeding of the metal dots 104 results in diamond growth only on these seeded areas. By controlling the distance between seeded areas of the metal dots 104 and the diamond growth time, overall coalescence of the diamond film can be controlled leaving behind tiny nanopores, for example, the produced nanoporous diamond membranes or diamond films include nanopores of approximately 30 nm diameter, or in a range of diameters between about 30 nm and 70 nm.

The selective seeding of the metal dots 104 includes a seeding solution of detonated nanodiamond, with an agglomeration size, for example of 5 nm in deionized (DI) water. A concentration includes, for example, 0.5 wt. % in DI water, and further diluted 5× in DI water. The selective seeding process includes an ultrasonication seeding process with ultrasonication for a set time period, such as between about 10 and 15 minutes followed by rinsing in DI water and nitrogen ($N_2$) blow dry cleaning.

Figure 1C:
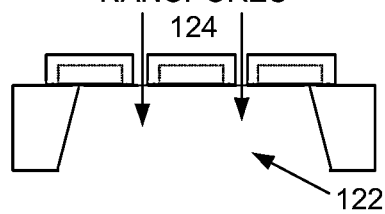

FIG. 1C, a next processing step is generally designated by the reference character 120. Back etching of the under laying silicon 104, for example, using KOH is performed to open nanopores 124 in the produced nanoporous diamond membrane. The produced nanoporous diamond membrane is a substantially uniform diamond membrane having a thickness of about 100 nm, with small nanopores 124 in a range of diameter between about 30 nm and 70 nm.

Figure 2A:
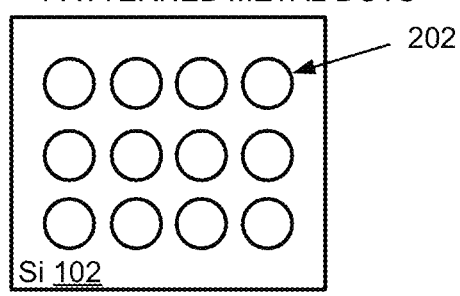
FIGS. 2A, 2B, are schematic plan views illustrating exemplary processing steps for fabricating nanoporous diamond membranes

Referring also to FIG. 2A, the selective diamond seeding process on the patterned metal dots is illustrated and generally designated by the reference character 200. The illustrated patterned metal dots on the silicon substrate 102 are generally designated by the reference character 202 and include a predefined spacing between the dots for the following controlled diamond film growth using a chemical vapor deposition (CVD).

Figure 2B:
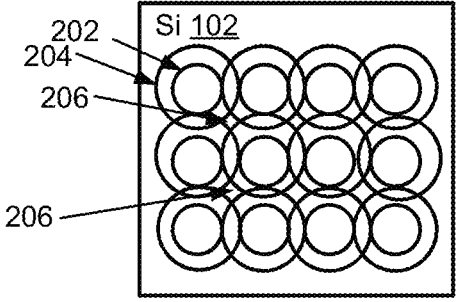

Referring also to FIG. 2B, the diamond film growth is illustrated and generally designated by the reference character 201. The nanoporous diamond membrane 204 produced by water based seeding includes ultrathin UNCD films on the silicon substrate 102 with tiny pinholes or nanopores 206 in the produced nanoporous diamond membrane.

Figure 2C:
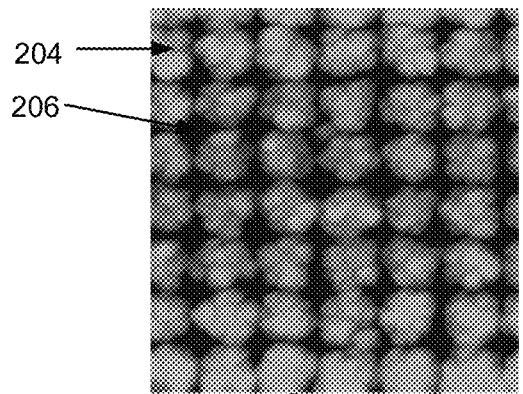
FIGS. 3A and 2C illustrates an example produced nanoporous diamond membrane in accordance with the preferred embodiment.

Referring also to FIG. 2C, there is shown an example produced nanoporous diamond membrane generally designated by the reference character 210 in accordance with the preferred embodiment.

Figure 3A:
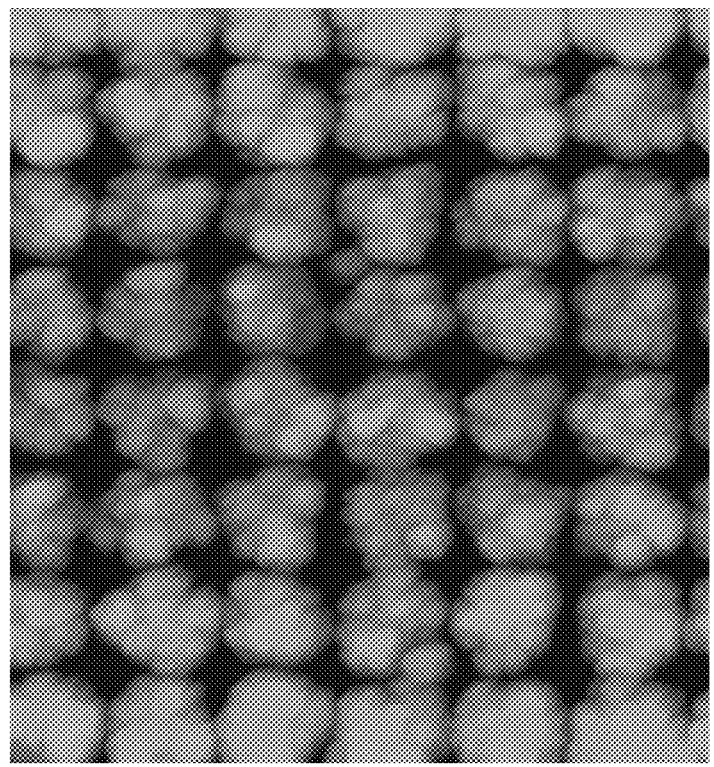
Figure 3B:
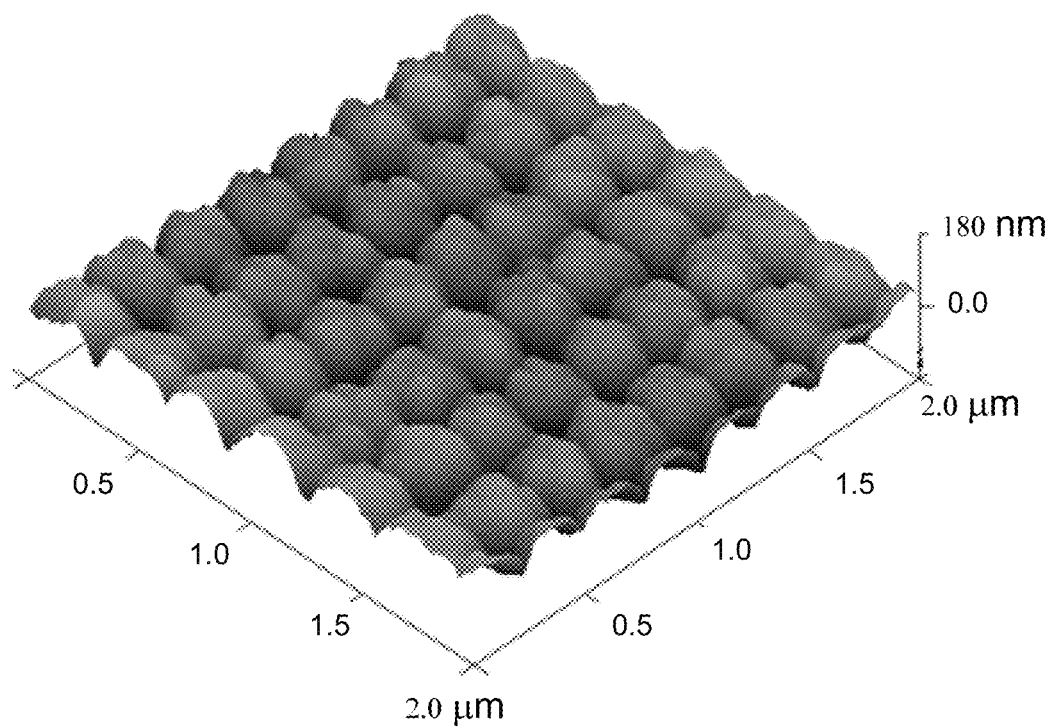

FIGS. 3A and 3B illustrate respective example nanoporous diamond membranes respectively generally designated by the reference characters 300 and 350 in accordance with the preferred embodiment. The illustrated nanoporous diamond membrane 350 includes a scale showing an area of about 2.0 µm×2.0 µm and a UNCD nanoporous diamond membrane thickness of approximately 100 nm.

While the present invention has been described with reference to the details of the embodiments of the invention shown in the drawing, these details are not intended to limit the scope of the invention as claimed in the appended claims.

What is claimed is:

1. A method to fabricate nanoporous diamond membranes comprising the steps of:
   providing a silicon substrate;
   producing patterned metal dots on said silicon substrate with a predefined spacing between the patterned metal dots;
   providing selective seeding of said patterned metal dots on said silicon substrate with a nanodiamond solution in water with controlled lateral diamond film growth producing a nanoporous diamond membrane; and
   etching of the under laying silicon to open nanopores in the produced nanoporous diamond membrane.

2. The method to fabricate nanoporous diamond membranes as recited in claim 1 wherein producing patterned metal dots on said silicon substrate with said predefined spacing between the patterned metal dots includes using an optical lithography.

3. The method to fabricate nanoporous diamond membranes as recited in claim 1 wherein producing patterned metal dots on said silicon substrate with said predefined spacing between the patterned metal dots includes a laser write to produce submicron sized metal dots.

4. The method to fabricate nanoporous diamond membranes as recited in claim 1 wherein nanodiamond grain size in water solution used for the selective seeding is provided in the range of approximately 4-5 nm.

5. The method to fabricate nanoporous diamond membranes as recited in claim 1 wherein producing patterned metal dots includes producing patterned carbide forming metal layer.

6. The method to fabricate nanoporous diamond membranes as recited in claim 1 wherein said carbide forming metal layer is a selected one of Tungsten (W), Titanium (Ti), Tantalum (Ta), and Molybdenum (Mo).

7. The method to fabricate nanoporous diamond membranes as recited in claim 1 wherein said nanopores having a pore diameter in a range between about 30 nm and 70 nm.

8. The method to fabricate nanoporous diamond membranes as recited in claim 1 wherein etching of the under laying silicon to open said nanopores in the produced nanoporous diamond membrane includes using KOH.

9. The method to fabricate nanoporous diamond membranes as recited in claim 1 wherein providing selective seeding of said patterned metal dots on said silicon substrate with said nanodiamond solution in water with controlled lateral diamond film growth producing a nanoporous diamond membrane includes using said nanodiamond solution in deionized water.

10. The method to fabricate nanoporous diamond membranes as recited in claim 9 includes using a detonated nanodiamond solution.

11. The method to fabricate nanoporous diamond membranes as recited in claim 9 includes using a chemical vapor deposition (CVD) process.

12. The method to fabricate nanoporous diamond membranes as recited in claim 9 includes an ultrasonication seeding process.

13. The method to fabricate nanoporous diamond membranes as recited in claim 12 wherein said ultrasonication seeding process includes ultrasonication for a set time period.

14. The method to fabricate nanoporous diamond membranes as recited in claim 12 wherein said set time period of said ultrasonication seeding process is provided in a range between 10 minutes and 15 minutes.

15. The method to fabricate nanoporous diamond membranes as recited in claim 12 wherein said ultrasonication seeding process is followed by rinsing in deionized water.

16. The method to fabricate nanoporous diamond membranes as recited in claim 15 includes nitrogen ($N_2$) blow dry cleaning.

\* \* \* \* \*